(12) United States Patent
Oyamada

(10) Patent No.: US 7,397,662 B2
(45) Date of Patent: Jul. 8, 2008

(54) ELECTRONIC CARD UNIT AND METHOD FOR REMOVING HEAT FROM A HEAT-GENERATING COMPONENT ON A PRINTED CIRCUIT BOARD

(75) Inventor: Takashi Oyamada, Tokyo (JP)

(73) Assignee: NEC Corporation, Tokyo (JP)

( * ) Notice: Subject to any disclaimer, the term of this patent is extended or adjusted under 35 U.S.C. 154(b) by 381 days.

(21) Appl. No.: 11/003,403

(22) Filed: Dec. 6, 2004

(65) Prior Publication Data

US 2005/0122686 A1 Jun. 9, 2005

(30) Foreign Application Priority Data

Dec. 5, 2003 (JP) ............................. 2003-406653

(51) Int. Cl.
*H05K 7/20* (2006.01)
*F28F 7/00* (2006.01)
(52) U.S. Cl. .................... 361/699; 361/715; 361/719; 165/80.4
(58) Field of Classification Search ................ 361/690, 361/694, 695, 700, 719, 699; 165/80.4
See application file for complete search history.

(56) References Cited

U.S. PATENT DOCUMENTS

| | | | |
|---|---|---|---|
| 4,366,526 A | 12/1982 | Lijoi et al. | |
| 5,216,578 A * | 6/1993 | Zenitani et al. | 361/690 |
| 5,285,347 A | 2/1994 | Fox et al. | |
| 5,684,674 A * | 11/1997 | Yin | 361/695 |
| 6,016,251 A * | 1/2000 | Koide et al. | 361/699 |
| 6,239,972 B1 * | 5/2001 | Tehan et al. | 361/704 |
| 6,621,713 B2 * | 9/2003 | Amaike et al. | 361/797 |
| 6,804,117 B2 * | 10/2004 | Phillips et al. | 361/700 |
| 6,839,235 B2 * | 1/2005 | St. Louis et al. | 361/700 |
| 6,909,603 B2 * | 6/2005 | Wiley | 361/690 |
| 2003/0000721 A1 | 1/2003 | Garner | |

FOREIGN PATENT DOCUMENTS

| | | |
|---|---|---|
| GB | 2 076 141 | 11/1981 |
| JP | 63-152200 | 6/1988 |
| JP | 10-270884 | 10/1998 |
| JP | 2003-218572 | 7/2003 |
| WO | WO 02/080270 | 10/2002 |
| WO | WO 2004/031673 | 4/2004 |

* cited by examiner

*Primary Examiner*—Gregory D Thompson
(74) *Attorney, Agent, or Firm*—Young & Thompson

(57) ABSTRACT

A heat-radiating structure of an electronic card unit is compact and reinforces a printed circuit board while improving heat radiation efficiency. Card unit 6 has dual function reinforcing plate-heat dissipaters 17 and 18 at the upper and lower edges of a printed circuit board 12 on which a heat-generating component 19 is mounted. Heat generated by component 19 is conducted to the reinforcing plate-heat dissipaters by passing a fluid in a heat pipe 21, a heat-conducting sheet 31 or a heat radiation circulation pipe 41 to be removed into the air. The reinforcing plates-heat dissipaters 17 and 18 are formed with a plurality of air vents 17a and 18a.

12 Claims, 5 Drawing Sheets

ELECTRONIC CARD UNIT AND METHOD FOR REMOVING HEAT FROM A HEAT-GENERATING COMPONENT ON A PRINTED CIRCUIT BOARD

BACKGROUND OF THE INVENTION

1. Field of the Invention

The present invention relates to an electronic card unit and a method for removing heat generated from electronic components. In preferred embodiments, the card unit has a heat-radiating structure which can efficiently remove heat generated from electronic components in the electronic card unit.

2. Description of Related Art

Electronic components such as highly integrated semiconductor devices produce heat when the components are activated. Heat removal is essential for an electronic card unit which consists of such electronic component mounted on a printed circuit board. In particular, in electronic communication equipment having a plurality of card units in its card slots, a large amount of heat is generated. Efficient heat removal poses a serious technical problem. For this reason, various techniques have been proposed.

In a heat radiating structure disclosed in Japanese Unexamined Patent Publication No. Sho 63(1988)-152200, a component as a source of heat on a printed circuit board is connected to heat-cooling fins via a pipe, and the fins are further connected to movable heat-cooling fins that protrude into an air chamber, whereby heat is efficiently removed.

In a heat-radiating structure disclosed in Japanese Unexamined Patent Publication No. Hei 10(1998)-270884 (Patent Document 2), a pipe on the side of component connected to a heat-generating element on a printed circuit board is removably connected to another pipe connected to a heat-radiating plate placed on the top surface of communication equipment, thereby removing heat of the heat-generating element from the external heat-radiating plate through the connected heat pipes.

In general, a number of card-like electronic units are accurately inserted into an electronic communication equipment frame, and as described above, heat must be efficiently removed. Therefore, printed circuit boards of electrical modules are required to be robust and accurate. Furthermore, the space for removing heat must be compactly allocated.

The heat-radiating structure described in Japanese Unexamined Patent Publication No. Sho 63(1988)-152200 (the third to 15th lines in the lower right section of P. 1, FIG. 1) has fixed heat-radiating fins and movable heat-radiating fins. Thus, it is difficult to produce a robust and accurate cooling system. In addition, the fin construction prevents the system from being compact.

Heat-radiating space in the equipment must be provided, such that the heat-radiating structure described in Patent Document of Japanese Unexamined Patent Publication No. Hei 10(1998)-270884 (paragraphs 0011 to 0013, FIG. 1) conducts heat from the heat-generating element through the heat pipes to the external heat-radiating plate. Therefore, it is difficult to compactly design the heat-radiating structure.

SUMMARY OF THE INVENTION

An object of the present invention is to provide an electronic module and a heat-radiating structure of the same which are compact, which can reinforce a printed circuit board and which radiate heat efficiently.

According to one embodiment of the present invention, an electronic module has a printed circuit board on which a heat-generating component is mounted and is intended to be inserted into an electronic equipment frame, comprises: a reinforcing plate fixed to at least one of the upper and lower edges of the printed circuit board; and a heat conducting structure that conducts heat generated by the heat-generating component to the reinforcing plate.

The reinforcing plate preferably has a plurality of air vents.

In preferred embodiments, the heat-conducting structure includes a heat-absorbing element contacting the heat-generating component; and a heat pipe extended from the heat-absorbing element to contact and be fixed along the reinforcing plate.

Alternatively, in place of the heat pipe, there may be used a heat-conducting sheet having one end contacting the heat-absorbing element and the other end buried into the reinforcing plate.

Alternatively, in place of the heat pipe, there may be used a heat radiation circulation pipe extending through the heat-absorbing element and disposed along the outer edge portion of the printed circuit board and contacting and fixed on the reinforcing plate, thereby forming a circulation path in which a fluid sealed therein passes through the inside of the heat-absorbing element to be flowed along the reinforcing plate and to returning to the heat-absorbing element.

The heat-conducting structure of this embodiment further preferably includes a pump forcefully circulating the fluid in the heat radiation circulation pipe.

According to another embodiment of the present invention, an electronic module has a printed circuit board on which a heat-generating component is mounted and is intended to be inserted into an electronic equipment frame. This module comprises an L-shaped heat dissipating plate fixed to at least one of the upper and lower edges of the printed circuit board; and a heat-conducting structure conducting heat generated by the heat-generating component to the L-shaped heat dissipating plate.

According to a further embodiment of the present invention, a method for removing heat from a heat-generating component using a heat-absorbing element on a printed circuit board comprises: conducting the heat from the heat-absorbing element on the heat generating component to the reinforcing plate fixed to at least one of the upper and lower edges of the printed circuit board through a heat-conducting member.

The heat-conducting member may be a heat radiation circulation pipe for conducting the heat generated by the heat-generating component to the reinforcing plate.

The heat-conducting member may be a sheet on the printed circuit board for conducting the heat generated from the heat generating component to the reinforcing plate.

The heat-conducting member may be a heat radiation circulation pipe disposed around the printed circuit board and passed through the heat-sink and circulating fluid in the pipe to remove the heat from the heat-generating component.

A pump to circulate the fluid may also be included.

The reinforcing plate preferably has a plurality of air vents for removing the heat from the heat generating component through the heat radiation circulation pipe.

According to the present invention, it is preferred that heat generated in the heat-generating component is conducted to the reinforcing plate provided at the edge of the printed circuit board. The reinforcing plate can be used as heat dissipation structure. This can increase the robustness of the printed circuit board and can efficiently dissipate heat from the reinforcing plate, thereby obtaining a compact heat-radiating structure. In particular, the reinforcing plate preferably has the air vents, thereby improving heat dissipation efficiency.

The heat radiation circulation pipe is preferably disposed as the heat-conducting structure along the outer edge portion of the printed circuit board to circulate a fluid, thereby efficiently removing heat from the heat-generating component. When the fluid is forcefully circulated by a pump, a cooling effect enough for a large amount of generated heat can be obtained. The flow rate of the fluid can be controlled by the pump to accommodate variation in the amount of generated heat.

BRIEF DESCRIPTION OF THE DRAWINGS

The above and other objects, features and advantages of the present of invention will become more apparent from the following detailed description when taken in conjunction with the accompanying, drawings wherein.

DETAILED DESCRIPTION OF THE PREFERRED EMBODIMENTS

Figure 1:
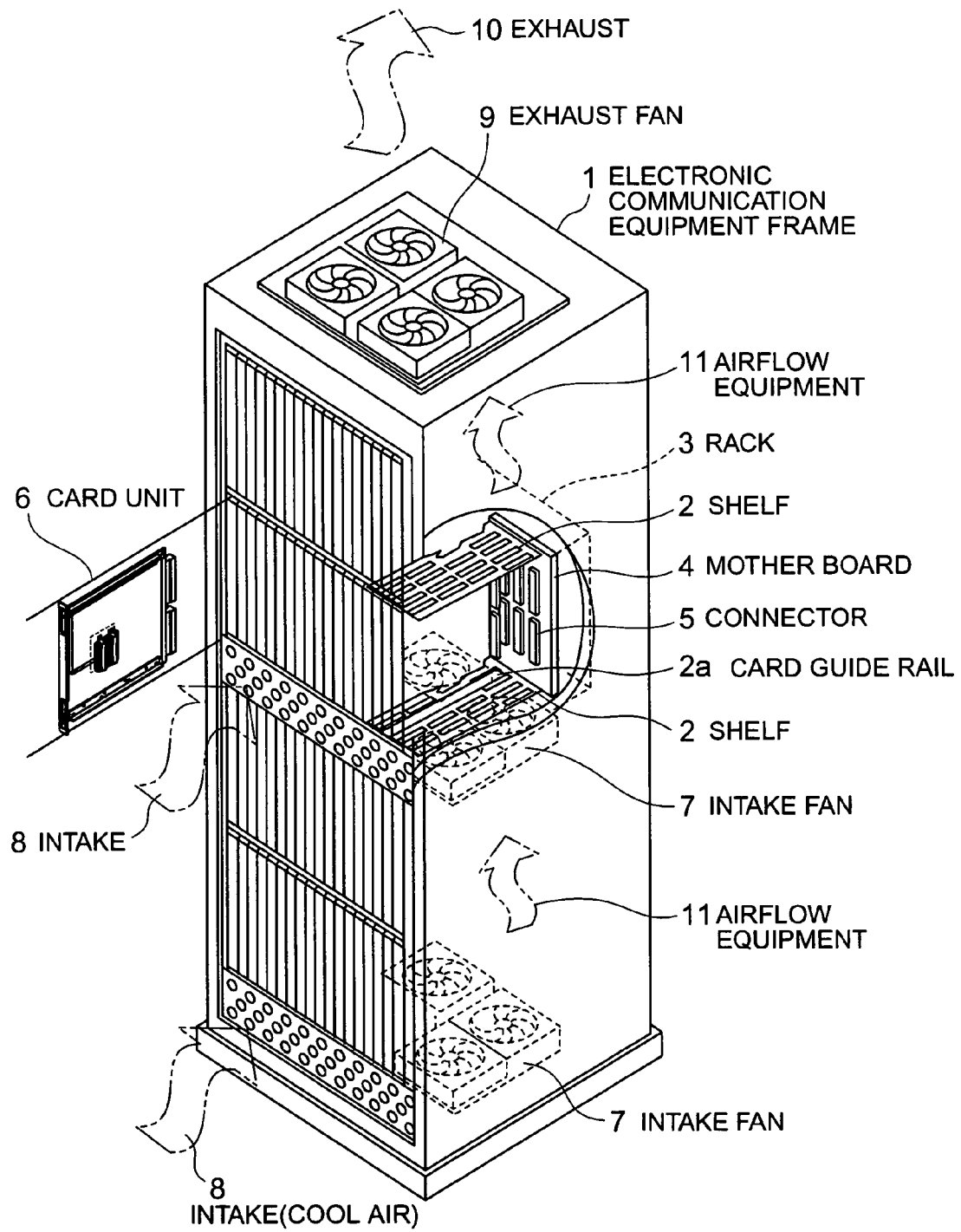
FIG. 1 is a perspective view showing an example of an electronic communication equipment frame into which an electronic module according to the present invention is inserted.

FIG. 1 is a perspective view showing an example of an electronic communication equipment frame into which an electronic module according to the present invention is inserted. An electronic communication equipment frame 1 has a plurality of shelves 2 in its inside and has a plurality of racks 3. One rack 3 into which a predetermined number of card-like electronic units 6 can be plugged-in has upper and lower shelves 2 having guide rails 2a arranged to be opposite each other and a mother board 4 on the back of the equipment. The mother board 4 is provided with a plurality of connectors 5 in predetermined positions. When an electronic card unit 6 is inserted into one of the connectors 5 through the guide rails 2a, the connector 5 is electrically and mechanically connected to the connector of the electronic card unit 6.

When a number of the electronic card units 6 are inserted into the electronic communication equipment frame, as described above, a large amount of heat is generated. To remove the heat, the electronic communication equipment frame 1 is provided in the bottom and middle stages with intake fans 7 and in its top surface with exhaust fans 9. The intake fans 7 take in outside cool air (INTAKE) 8. The exhaust fans 9 exhaust hot air from the equipment as exhaust 10 to the outside. The intake fans 7 and the exhaust fans 9 forcefully provide airflow 11 in the equipment and exhaust and remove a large amount of heat from a number of the electronic card units 6.

The constructions of the electronic card units according to some preferred embodiments of the present invention will be described in detail using FIGS. 2 to 5.

Figure 2:
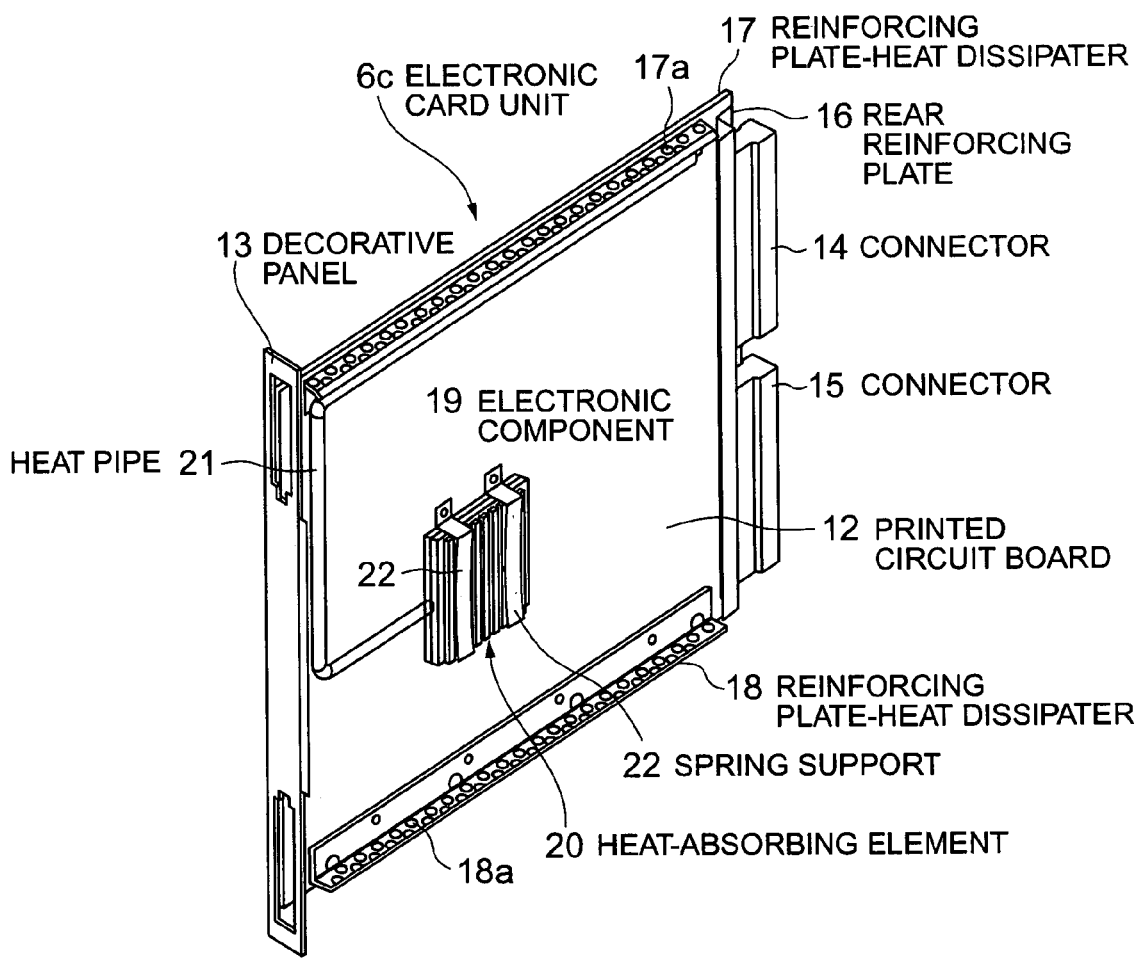
FIG. 2 is a perspective view of an electronic module according to a first embodiment of the present invention.

FIG. 2 is a perspective view of an electronic card unit according to a first embodiment of the present invention. In an electronic card unit 6a according to this embodiment, a printed circuit board 12 has at its front edge a decorative (outward-facing) panel 13 and at its rear edge connectors 14 and 15 for connection to connectors 5 of a mother board 4. A key-shaped rear reinforcing plate 16 is fixed to the rear edge of the printed circuit board 12, thereby improving robustness against deflection and warp on the back of the printed circuit board 12.

An L-shaped reinforcing plate-heat dissipater 17 is fixed to the upper edge of the printed circuit board 12. The reinforcing plate-heat dissipater 17 has a number of air vents 17a. Likewise, an L-shaped reinforcing plate-heat dissipater 18 is fixed to the lower edge of the printed circuit board 12. The reinforcing plate-heat dissipater 18 similarly has a number of air vents 18a. Such reinforcing plates-heat dissipaters 17 and 18 can improve robustness against deflection and warp of the upper and lower portions of the printed circuit board 12, and, as described in greater detail below, heat-radiating efficiency can be improved. The reinforcing plates-heat dissipaters 17 and 18 are formed by a metal material having sufficient robustness and good heat conductivity. For instance, aluminum, copper, and alloys of those metals can be used.

An electronic component 19 as a heat generation source is mounted in a predetermined position of the printed circuit board 12. A heat-absorbing element 20 formed with heat-radiating fins contacts the electronic component 19 with spring supports 22. A heat pipe 21 for conducting heat from the electronic component 19 is imbedded in the heat-absorbing element 20. The heat pipe 21 extends to the upper reinforcing plate-heat dissipater 17 and is fixed along and covered by the reinforcing plate-heat dissipater 17 with a metallic member or the like, to fix the heat pipe 21.

In such a construction, heat generated in the electronic component 19 is removed by the fins of the heat-absorbing element 20. The heat is then dissipated into the air from the reinforcing plate-heat dissipater 17 via the heat pipe 21. Since the reinforcing plate-heat dissipater 17 has a number of air vents 17a, heat conducted through the heat pipe 21 can be efficiently removed. Also, the reinforcing plate-heat dissipater 17 functions to reinforce the printed circuit board 12. Therefore, the reinforcing plate-heat dissipater 17 not only prevents the printed circuit board from warping but also improves the robustness and heat radiation efficiency. This makes the electronic card unit 6a more compact and robust.

In this embodiment, the printed circuit board 12 is provided at its upper and lower edges with the reinforcing plates-heat dissipaters 17 and 18. If sufficient warp prevention and robustness can be obtained, only one of the upper and lower edges need be provided with the reinforcing plate-heat dissipater 17 or 18.

Figure 3:
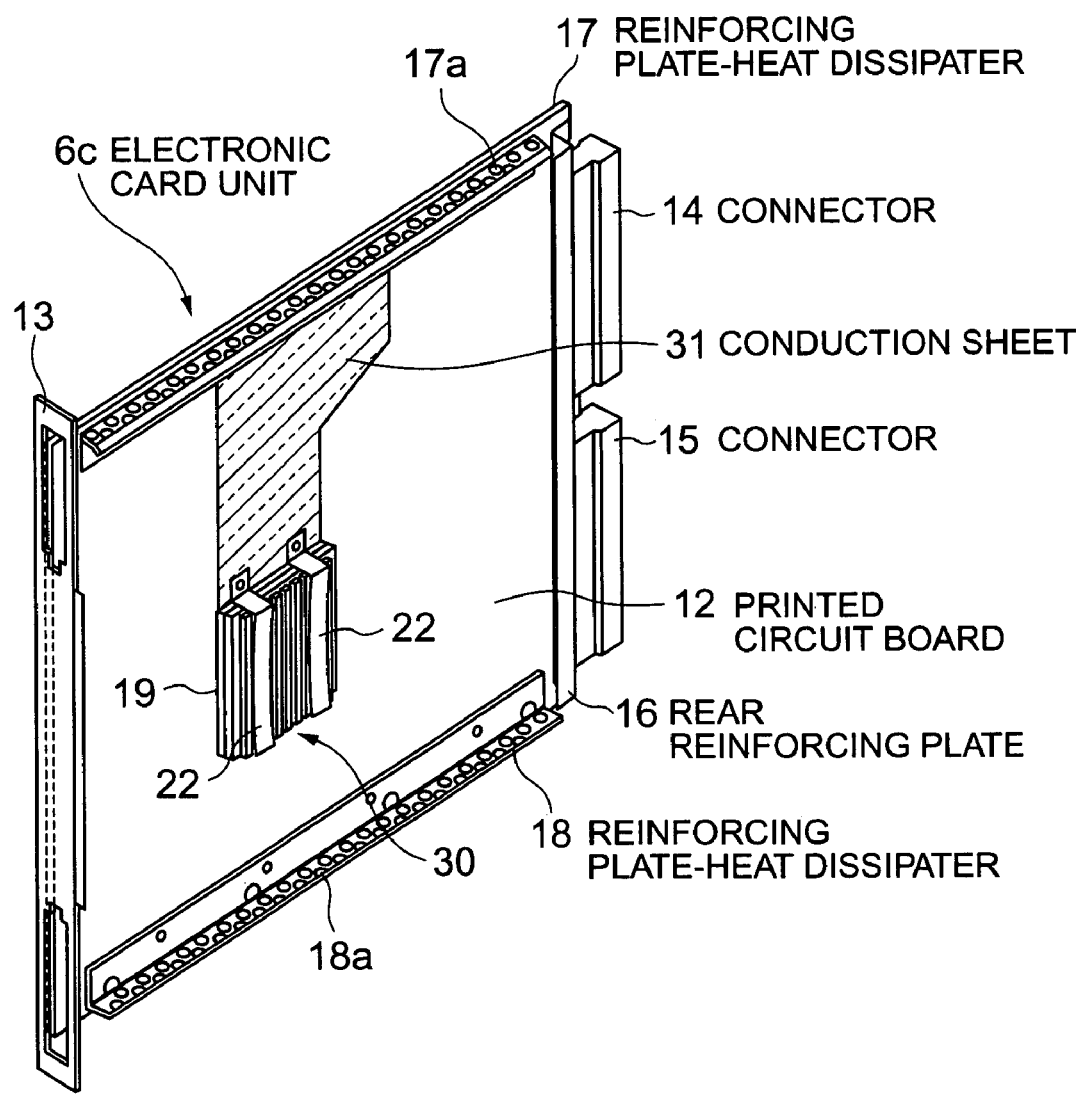
FIG. 3 is a perspective view of an electronic module according to a second embodiment of the present invention.

In FIG. 3, an electronic card unit 6b according to a second embodiment has a heat-conducting structure different from that of the first embodiment. Other than that, it has similar function and construction as the first embodiment, which are indicated by the same reference numerals, and the description is omitted.

In FIG. 3, a heat-absorbing element 30 having fins is in contact with the electronic component 19 mounted on a printed circuit board 12, and a heat-conducting sheet 31 is contacts the heat-absorbing element 30 with spring supports 22. The heat-conducting sheet 31 is formed by a material having high heat conductivity, e.g., graphite. The heat-conducting sheet 31 extends to and is imbedded in an upper reinforcing plate-heat dissipater 17. The width of the heat-conducting sheet 31 is about the same as the width of the component 19 at its central end, but is wider at its peripheral end adjacent the reinforcing plate-heat dissipater 17 side, thereby improving the heat radiation effect.

In such a construction, heat generated in the electronic component 19 is removed by the fins of the heat-absorbing element 30 and removed from the reinforcing plate-heat dissipater 17 into the air after passing along the heat-conducting sheet 31. Since the reinforcing plate-heat dissipater 17 has a number of air vents 17a for removing heat, heat conducted through the heat-conducting sheet 31 can be efficiently removed. The reinforcing plate-heat dissipater 17 also serves to reinforce the printed circuit board 12, as in the first embodiment. This makes the electronic card unit 6a be more compact, lightweight and robust.

In this embodiment, the heat-conducting sheet 31 is connected to the upper reinforcing plate-heat dissipater 17. Heat radiation capacity can be further improved when an additional heat-conducting sheet is connected to the lower reinforcing plate-heat dissipater 18. In such an embodiment, the printed circuit board 12 is provided at the upper and lower edges with the reinforcing plates-heat dissipaters 17 and 18. However, if sufficient warp prevention and robustness can be obtained with only one such element, then either of the upper and lower edges may be provided with just one of the reinforcing plate-heat dissipater 17 or 18.

Figure 4:
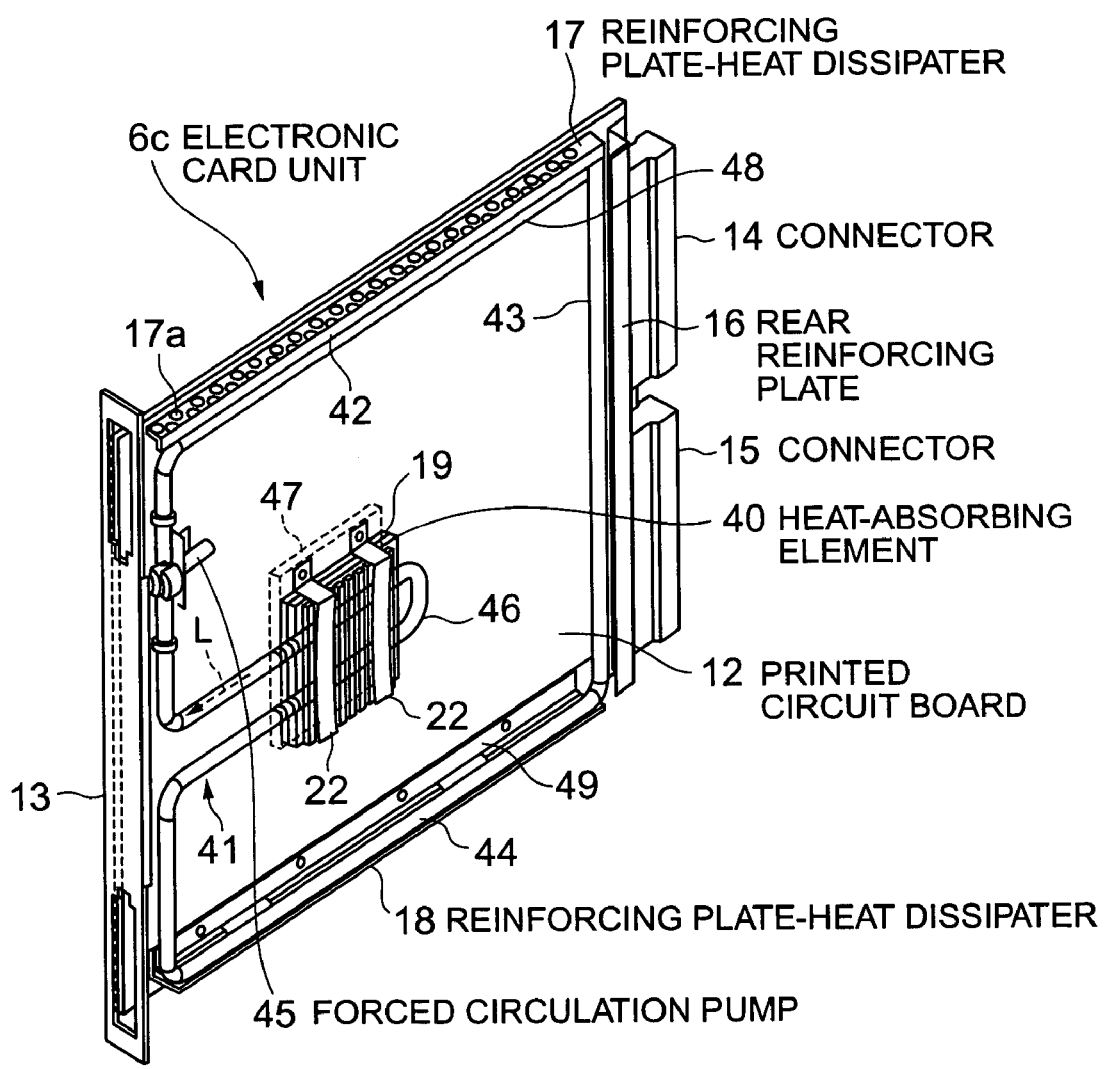
FIG. 4 is a perspective view of an electronic module according to a third embodiment of the present invention.
Figure 5:
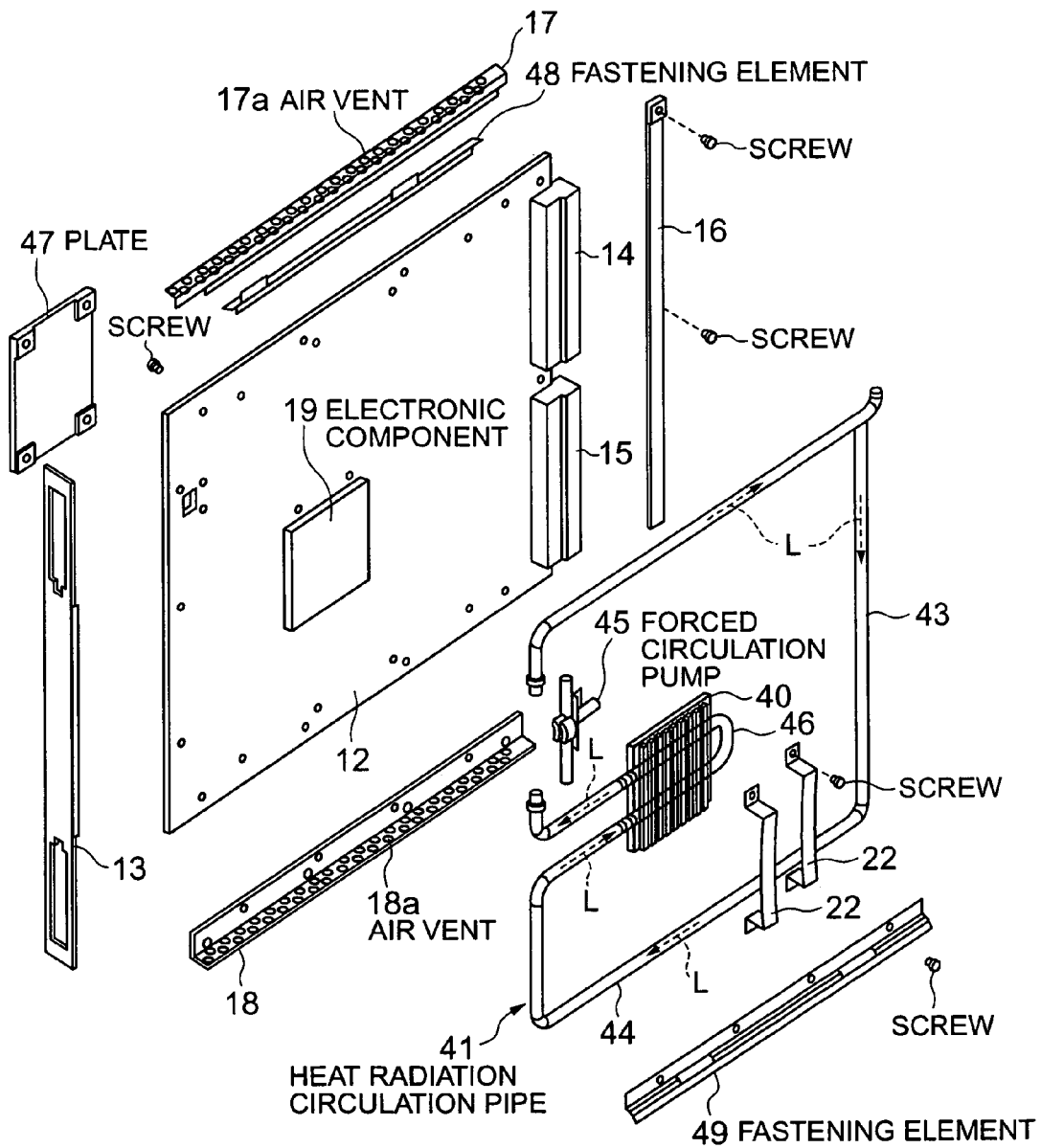
FIG. 5 is an exploded perspective view of the electronic module shown in FIG. 4.

FIG. 4 is a perspective view of an electronic card unit according to a third embodiment of the present invention, and FIG. 5 is an exploded perspective view thereof. In the electronic card unit 6c of this third embodiment, the electronic component 19 as a heat generation source is mounted in a predetermined position of the printed circuit board 12 by a metal plate 47 on the back side. A heat-absorbing element 40 formed with heat-cooling fins contacts the electronic component 19 with spring supports 22. A heat radiation circulation pipe 41 for removing heat from the electronic component 19 by circulating a fluid penetrates the heat-absorbing element 40 in a U shape.

The heat radiation circulation pipe 41 is formed in a loop along the outer edge portion of the printed circuit board 12. A fluid sealed therein is circulated passively or forcefully in the direction of the arrow L. In this embodiment, the heat radiation circulation pipe 41 extends from the heat-absorbing element 40 through a forced circulation pump 45 to the upper reinforcing plate-heat dissipater 17. An upper heat radiating portion 42 of the heat radiation circulation pipe 41 is fixed along the reinforcing plate-heat dissipater 17 with a fastening element 48. The heat radiation circulation pipe 41 passes under the rear reinforcing plate 16 in a rear heat-radiating portion 43 continued to the upper heat-radiating portion 42 and is extended to the lower reinforcing plate-heat dissipater 18. A lower heat-radiating portion 44 of the heat radiation circulation pipe 41 is fixed along the reinforcing plate-heat dissipater 18 with a fastening element 49 and returns to the heat-absorbing element 40. A U-shaped portion 46 of the heat radiation circulation pipe 41 extends through the heat-absorbing element 40. Heat generated by the electronic component 19 is conducted to the fluid in the heat radiation circulation pipe 41.

In this embodiment, the fluid in the heat radiation circulation pipe 41 is actively circulated by the forced circulation pump 45 in the direction of the arrow L. In such a construction, heat generated in the electronic component 19 is removed by the fins of the heat-absorbing element 40 and is absorbed by the fluid flowing in the U-shaped portion 46 of the heat radiation circulation pipe 41. The hot fluid flows through the forced circulation pump 45 in the direction L and passes through the upper heat-radiating portion 42. Since the fluid is moved to the upper reinforcing plate-heat dissipater 17, the heat of the fluid is removed into the air. The cooled fluid is further cooled while passing through the rear heat-radiating portion 43 of the heat radiation circulation pipe 41. Since the fluid further passes through the lower heat-radiating portion 44 of the heat radiation circulation pipe 41, the heat of the fluid is moved to the lower reinforcing plate-heat dissipater 18. Therefore, the heat of the fluid is removed into the air. The cooled fluid passes in the heat-absorbing element 40 again to repeat the above-described heat absorption and radiation process.

Especially when the fluid in the heat radiation circulation pipe 41 is actively circulated by the forced circulation pump 45, a significant cooling and heat radiation effect is obtained. In particular, the forced circulation pump 45 controls the flow rate, thereby accommodating the heat radiation demand of a panel having large power consumption and variation in the amount of generated heat. When the amount of generated heat of the electronic component 19 is relatively small, natural or passive circulation, as opposed to forced circulation by the pump, may be used.

The upper and lower reinforcing plate-heat dissipaters 17 and 18 provide the same functions and advantages as in the previous embodiments.

An electronic card unit and a heat-radiating structure of the same according to the present invention can be applied to an electronic card unit alone in electronic communication equipment in which a number of card units are inserted into a frame and are operated. The invention is particularly well-suited to a heat-radiating structure of a heat-generating component mounted on a printed circuit board of an electronic card unit.

What is claimed is:

1. An electronic module which has a circuit board on which a heat-generating component is mounted and is intended to be inserted into an electronic equipment frame, comprising:
    a reinforcing plate fixed to at least one of the upper and lower edges of said circuit board; and
    a heat-conducting structure conducting heat generated by said heat-generating component to said reinforcing plate,
    wherein said reinforcing plate has a plurality of air vents.

2. The electronic module according to claim 1,
    wherein said heat-conducting structure comprises:
    a heat-absorbing element contacting said heat-generating component; and
    a heat radiation circulation pipe extending through said heat-absorbing element and disposed along the outer edge portion of said circuit board and contacting said reinforcing plate, thereby forming a circulation path in which a fluid sealed therein passes through the inside of said heat-absorbing element to be flowed along said reinforcing plate for returning to said heat-absorbing element.

3. The electronic module according to claim 1,
    wherein said heat-conducting structure comprises:
    a heat-absorbing element contacting said heat-generating component; and
    a heat radiation circulation pipe extending through said heat-absorbing element and disposed along the outer edge portion of said circuit board and contacting said reinforcing plate, thereby forming a circulation path in which a fluid sealed therein passes through the inside of said heat-absorbing element to be flowed along said reinforcing plate for returning to said heat-absorbing element.

4. The electronic module according to claim 2, wherein said heat-conducting structure further comprises a pump that actively circulates said fluid in said heat radiation circulation pipe.

5. The electronic module according to claim 3, wherein said heat-conducting structure further comprises a pump that actively circulates said fluid in said heat radiation circulation pipe.

6. The electronic module according to claim 1, wherein said heat-conducting structure comprises:
   a heat-absorbing element contacting said heat-generating component; and
   a heat pipe extending from said heat-absorbing element and contacting said reinforcing plate.

7. The electronic module according to claim 1, wherein said heat-conducting structure comprises:
   a heat-absorbing element contacting said heat-generating component; and
   a heat-conducting sheet having one end contacting said heat-absorbing element and another end embedded in said reinforcing plate.

8. A method for removing heat from heat-generating component provided with a heat-absorbing element on a circuit board, said method comprising:
   conducting heat from the heat-absorbing element on the heat generating component to a reinforcing plate fixed to at least one of the upper and lower edges of the circuit board, via a heat-conducting member,
   wherein the reinforcing plate has a plurality of air vents for removing the heat from the heat generating component through the heat radiation circulation pipe.

9. The method according to claim 8, wherein the heat-conducting member is a heat radiation circulation pipe for conducting the heat generated from the heat generating component to the reinforcing plate.

10. The method according to claim 8, wherein the heat conducting member is a heat radiation circulation pipe disposed around the circuit board and passed through a heat absorbing element and circulating fluid in the pipe to remove heat from the heat generating component.

11. The method according to the claim 8, wherein a pump is provided to circulate the fluid.

12. The method according to claim 8, wherein the heat conducting member is a sheet on the circuit board for conducting the heat generated from the heat generating component to the reinforcing plate.

* * * * *